(12) United States Patent
Ceraso (10) Patent No.: US 9,326,390 B2
(45) Date of Patent: Apr. 26, 2016

(54) MANUFACTURING OF STACKS OF MULTILAYER PLASTIC LAMINATES FOR PRINTED CIRCUITS

(75) Inventor: Bruno Ceraso, Albizzate (IT)

(73) Assignee: CEDAL EQUIPMENT SRL, Milan (MI) (IT)

( * ) Notice: Subject to any disclaimer, the term of this patent is extended or adjusted under 35 U.S.C. 154(b) by 212 days.

(21) Appl. No.: 13/982,341

(22) PCT Filed: Mar. 9, 2012

(86) PCT No.: PCT/IT2012/000066
§ 371 (c)(1),
(2), (4) Date: Sep. 25, 2013

(87) PCT Pub. No.: WO2013/121450
PCT Pub. Date: Aug. 22, 2013

(65) Prior Publication Data
US 2014/0020245 A1    Jan. 23, 2014

(30) Foreign Application Priority Data
Feb. 13, 2012   (IT) .............................. MI2012A0194

(51) Int. Cl.
*H05K 3/10*      (2006.01)
*H05K 3/46*      (2006.01)
(Continued)

(52) U.S. Cl.
CPC ................ *H05K 3/4644* (2013.01); *B32B 7/12* (2013.01); *B32B 29/00* (2013.01); *H05K 3/4652* (2013.01);
(Continued)

(58) Field of Classification Search
CPC ...... H05K 3/4644; H05K 3/4652; B32B 7/12; B32B 29/00
See application file for complete search history.

(56) References Cited

U.S. PATENT DOCUMENTS

| | | | | |
|---|---|---|---|---|
| 4,446,188 A | * | 5/1984 | Patel ....................... | B32B 15/08 428/138 |
| 5,688,352 A | * | 11/1997 | Ceraso ................ | B29C 65/3444 100/320 |

(Continued)

FOREIGN PATENT DOCUMENTS

| EP | 0 785 068 A2 | 7/1997 |
|---|---|---|
| EP | 0 796 732 A2 | 9/1997 |

(Continued)

OTHER PUBLICATIONS

International Search Report, dated Mar. 1, 2013, from corresponding PCT application.

*Primary Examiner* — Minh Trinh
(74) *Attorney, Agent, or Firm* — Young & Thompson (57) ABSTRACT

In manufacturing multilayer plastic laminates for printed circuits, a press with two surfaces exerts pressure under vacuum on a stack of laminates, the packs, alternated with separator plates made of anodized aluminum. The packs include prepreg layers. The metalizations present on the two sides of each pack are portions of a copper strip repeatedly folded 180° around each pack and each separator plate. A strong current circulates in the copper strip which heats the strip with resistive behavior: the heat causes the close fixing of the various layers. An auxiliary heater is applied to each surface of the press by element of an interposed insulating plate. This includes an aluminum plate with equidistant longitudinal holes containing the same number of armored candle-like resistors, connected in parallel. A main power supply provides direct current to the copper strip, two secondary power supplies provide alternating current to the two auxiliary heaters.

11 Claims, 9 Drawing Sheets

(51) Int. Cl.
*B32B 7/12* (2006.01)
*B32B 29/00* (2006.01)

(52) U.S. Cl.
CPC .. *H05K 2203/068* (2013.01); *H05K 2203/1115* (2013.01); *Y10T 29/49124* (2015.01); *Y10T 29/5317* (2015.01)

(56) References Cited

U.S. PATENT DOCUMENTS

| | | | | |
|---|---|---|---|---|
| 6,230,473 | B1 * | 5/2001 | Rudolf | B65B 25/14 53/168 |
| 6,245,167 | B1 * | 6/2001 | Stein | B30B 7/02 156/228 |
| 2006/0218760 | A1 | 10/2006 | Bois et al. | |
| 2013/0220683 | A1 * | 8/2013 | Cai | H05K 3/4652 174/257 |
| 2013/0299227 | A1 * | 11/2013 | Chung | H05K 3/0097 174/266 |

FOREIGN PATENT DOCUMENTS

| | | |
|---|---|---|
| IT | 1255128 B | 10/1995 |
| IT | 1271942 B | 6/1997 |
| WO | 94/01263 A1 | 1/1994 |
| WO | 97/25841 A1 | 7/1997 |
| WO | 97/27051 A1 | 7/1997 |
| WO | 2004/103842 A1 | 11/2004 |

* cited by examiner

MANUFACTURING OF STACKS OF MULTILAYER PLASTIC LAMINATES FOR PRINTED CIRCUITS

FIELD OF APPLICATION OF THE INVENTION

The present invention refers to the field of printed circuits, and more specifically to improvements in the manufacturing of stacks of multilayer plastic laminates for printed circuits.

REVIEW OF THE PRIOR ART

Figure 1:
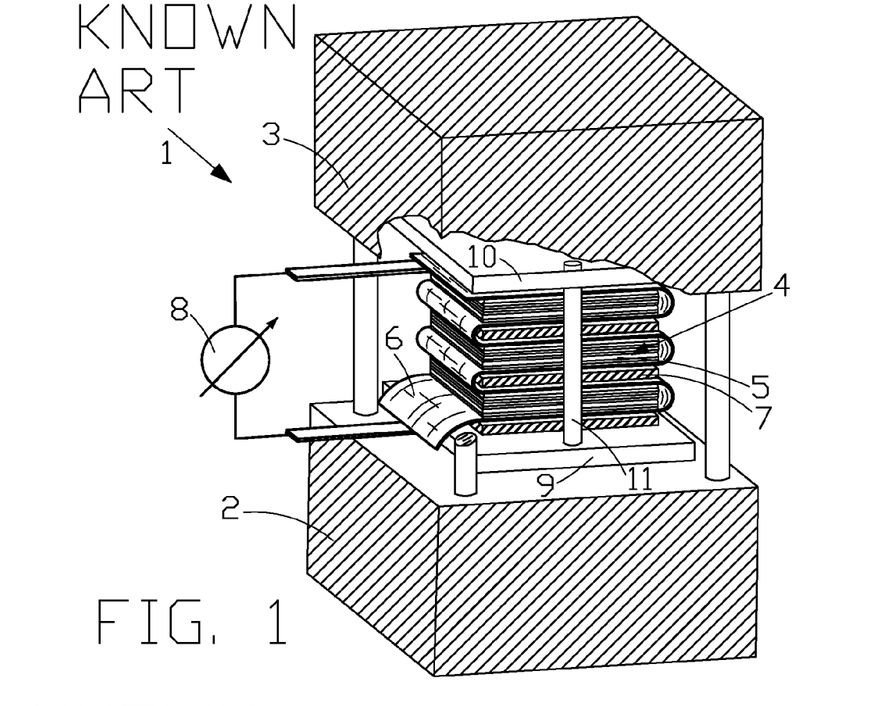
FIG. 1 is a perspective view of a press for producing multilayer laminates for the printed circuits stacked according to a known process.

The Italian patent No. 0001255128 of the same applicant refers to a "Process for producing plastic laminates with metal plates, especially for printed circuits", actuated as illustrated in FIG. 1 by means of a column hydraulic press 1 of descending type whose support surface 2 and pressure surface 3 are not heated. The process described in the first claim of the mentioned patent, with reference to FIG. 1, consists of forming a stack of packs 4, each comprising a group of support sheets 5 impregnated with plastic material and metal plates on one or both faces, characterized in that the metal plates are obtained from a continuous strip 6 arranged at the lower face of the first group of sheets, starting from the bottom, and then after a 180° fold, arranged on the upper face of such group, and after the deposition of a metal plate 7 and after a second 180° fold in reverse direction with respect to the first, arranged at the lower face of the second group of sheets and after a third 180° fold in reverse direction with respect to the second fold, arranged on the upper face of this second group of sheets and so on up to the upper face of the latter group of sheets; the two ends of the strip 6 are connected to an electric current generator 8 with suitable power, in a manner such that by generating a suitable pressure on the stack of packs, the electric circuit of the generator 8 closed, the various sections of the strip 6 mating with the faces behave like electrical resistors, obtaining the close connection between the various elements and the formation of the plastic laminates. Specifically, the strip 6 is made of copper, the metal plates 7 interposed between the various packs 4 are made of stainless steel, and each pack 4 is constituted by sheets 5 made of glass fiber fabric impregnated with epoxy resin. The stack of packs 4, including the copper strip 6 folded as a coil around the separator plates 7, is placed between two containment plates 9 and 10, respectively lower and upper, maintained aligned by two vertical cylinder rods 11.

Figure 2:
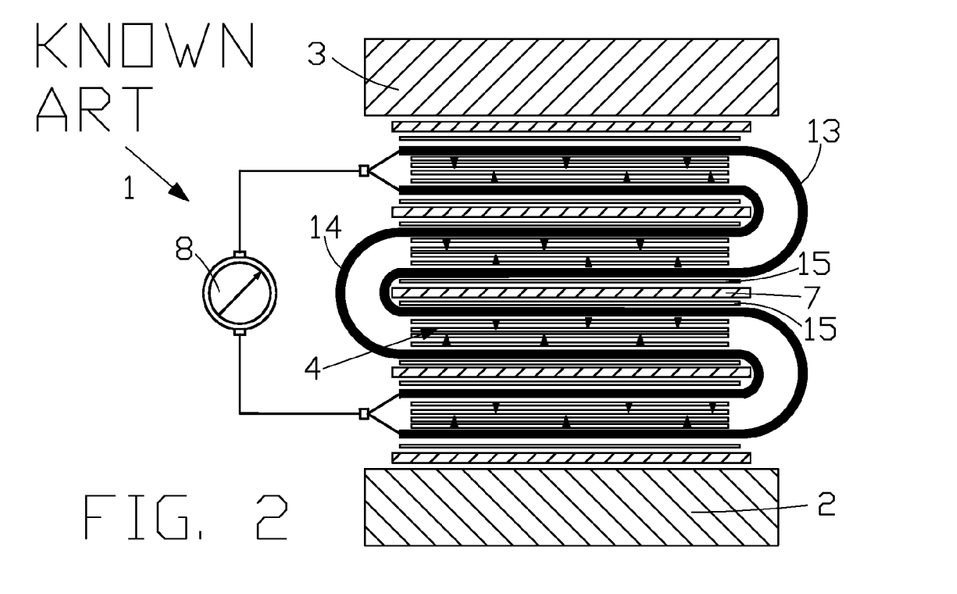
FIG. 2 is a schematic view which differs from the preceding, for an alternative, also known embodiment of the stack of multilayer packs.

FIG. 2 is referred to an alternative embodiment described in the Italian patent No. 0001271942 of the same applicant, which differs from the preceding embodiment due to the fact that in the heating of the packs 4 stacked between the two surfaces of the press 1, two copper strips 13 and 14 are used instead of the single strip 6 of FIG. 1; in addition, between said strips and the faces of the separator strips 7, single sheets of insulating paper 15 of Kraft type are placed. As can be observed in FIG. 2, the strips 13 and 14 are maintained parallel to each other in the multiple crossings of the stack of packs along a coil-like path. The single packs are comprised between the two strips 13 and 14 while the separator plates 7 with the respective paper sheets 15 are included in alternated loops formed by each strip 13, 14. The corresponding ends of each strip are connected to a same terminal of the generator 8, and thus the two strips are equivalent to two electric resistors of value R connected in parallel. From the electrical standpoint, given the same voltage V provided by the generator 8, the advantage of the configuration of FIG. 2 with respect to that of FIG. 1 in which the single copper strip has an electrical resistance equal to about 2R, consists of the passage in each copper strip 13 and 14 of a double current, involving the drainage of the generator 8 of an electric power linked with quadruple the heating of the preceding configuration. The arrows within the packs 4 indicate the passage of heat transmitted by the portions of the two copper strips. In addition, the interposition of the sheets of insulating paper 15 between the steel plates 7 and the copper of the strips 13 and 14, respectively below and above, prevents the drainage of additional current through such plates and the consequent excessive heating of the multilayer packs 4, with risk of burning, due to the reduction of the resistive level of the sections of copper strip 13 and 14 in contact with the steel plates 7.

UNDERLINING THE TECHNICAL PROBLEM

The use of a copper strip wound as a coil, in which heating current circulates as indicated above, allows a more uniform heat distribution along the stack of packs with respect to that allowed by the older multi-surface presses, in which only the packs at the two ends of the stack were in contact with the heating surfaces. While it has undeniable advantages, even the process that uses the copper strip for heating the packs is not free from drawbacks, in particular the packs at the ends of the stack result colder by about 50÷60° C. with respect to the center of the stack, and consequently these must often be discarded. The lower heating of the peripheral packs is partly due to the transfer of heat from the copper strip 6 to the metal plates 9 and 10 containing the stack, and partly due to the fact that such end packs benefit to a lesser extent from the thermal mass constituted around the packs closest to the center of the stack.

A disadvantage of smaller significance consists of the increase of assembly times for the stack of packs, due to the application of the Kraft paper sheets below and on top of the faces of each stainless steel separator sheet. In addition, the systematic interposition of the Kraft paper sheets slows the increase of the temperature within the stack.

SUMMARY OF THE INVENTION

An object of the present invention is to overcome the abovementioned drawbacks.

In order to attain such object, the present invention has as object a method for manufacturing multilayer plastic laminates for printed circuits, by means of:

a) constructing a stack of single multilayer plastic laminates, below termed packs, alternated with separator plates that are thermally conductive and electrically insulated, each pack comprising dielectric layers metalized on at least one face alternated with pre-preg adhesive layers, the two outermost layers of each pack being constituted by respective portions of at least one metallic tape, preferably made of copper, preferably made of copper, repeatedly folded 180° in opposite directions in order to form loops of a serpentine that systematically crosses the stack over the entire height thereof;

b) applying, under vacuum, pressure of controlled value on said stack by means of a two-plate press and simultaneously generating heat inside the stack, the heat being developed by the electric current made to circulate in the serpentine metal tape, with resistive behavior, by a main electric generator whose power supplied to the metal tape is controlled in a manner so as to increase according a pre-established gradualness the temperature measured inside the stack for a time sufficient for hardening the adhesive layers and achieving therefore the mutual fixing of the various layers as well as of the metal tape portions to the layers mating thereto;

c) returning to the initial pressure and temperature conditions;

d) cutting the metal tape flush with the opposite flanks of the stack from where it exists outward, and disassembling the single packs metalized in such a manner;

wherein according to the invention during step b) an additional calorie intake is supplied to the two ends of the stack by means of two auxiliary resistive heaters constrained to the two plates of the press and thermally insulated therefrom, said auxiliary heaters being power-supplied by respective secondary electric generators controlled in a manner so as to increase the temperature of the auxiliary heaters according to the aforesaid pre-established gradualness, being the power dissipated by the auxiliary heaters enough for obtaining in respective top and bottom packs of the stack approximately the same temperature as measured inside the stack.

By operating in such a manner, after an initial thermal transient time, the temperature of each heater will remain "coupled" to the temperature values measure inside the stack, up to the start of the polymerization of the resin in the prepreg, and this allows obtaining a polymerization and subsequent reticulation of the resin that is uniform in all the packs of the stack. Advantageously, the temperature coupling involves deviations of only ±3° C.

It should be pointed out that the preferred dielectric layers are in FR-4 and that the prepreg layers most used in the art of printed circuits are constituted by a glass fiber fabric pre-impregnated with only slightly polymerized epoxy resin. Further characteristics of the present invention, in its various embodiments that are deemed innovative, are described in the dependent claims.

The method is obviously applicable in the production of single laminates as well, i.e. those comprising only a single dielectric layer metalized on both faces. In the multilayer laminates, the metalizations of the internal layers comprise ground surfaces and circuit connection channels, the various layouts are maintained aligned with each other in order to allow a correct interconnection through the metalized holes. Advantageously, the stability of the alignment between all the layers that compose the single multilayer pack can be previously obtained in a known manner, by means of partial welding between the different layers at circumscribed areas belonging to a perimeter band lacking circuit layout, where several circular metalizations are present like spirals aligned between the various layers, if there are strong short-circuit induced currents capable of causing local welding.

The metalized multilayer plastic laminates as described in the present method are ready for subsequent processing, including perforation, masking and photoengraving of the circuit layout, removal of the excess copper, and metalization of the through holes.

According to one aspect of the invention, the pressure is exerted on the upper heater, and from this it is transmitted to the stack by means of an air chamber, below termed airbag, inflated at an initially fixed pressure, subsequently increased via discrete steps upon the verification of the obtainment of pre-established temperature values.

According to one aspect of the invention, said separator plates are made of aluminum anodized to get a black oxide surface layer electrically insulating and thermally radiating.

According to one aspect of the invention, the current supplied by the main electric generator crosses a metal casing of each auxiliary heater that encloses the resistive component electrically insulated by the casing.

According to one aspect of the invention, the copper tape portion at the base of the stack abuts against an extractible metal tray, preferably made of aluminum, crossed by the current supplied by the main electric generator and by the thermal flow generated by the auxiliary electric heater on which it rests.

According to one aspect of the invention, a metal plate is placed upon the copper tape portion at the top of the stack, such plate preferably made of aluminum, crossed by the current supplied by the main electric generator and by the thermal flow generated by the auxiliary electric heater with which it is in contact, improves distribution of the pressure on the stack.

According to one aspect of the invention, the loops of the copper tape formed at the top and on the bottom of the stack include, in sequence from the copper tape: two paper sheets of Kraft type, a damping pad layer made of plastic material, and one said separator plate.

According to one aspect of the invention, the two outermost layers of each pack being constituted by respective portions of two metallic tapes connected at their ends like two resistors in parallel crossed by the heating current for the stack, the two copper tapes forming along the stack two serpentines whose loops penetrate each other.

From that set forth above, a substantial difference is detected also with respect to the old hot presses, e.g. the multi-surface presses, in which it is impossible to regulate the temperature of the hot upper and lower surfaces in order to obtain temperature uniformity between the outermost packs and the center of the stack; this is due to the negative temperature gradient between the periphery and the center of the stack, which inevitably accompanies the distancing of the center of the stack from the heat sources.

Also, an object of the invention is a system for manufacturing a plurality of multilayer plastic laminates for printed circuits according to the above-illustrated modes, whose particular features comprise:

two auxiliary resistive heaters power-supplied by respective secondary electric generators, each auxiliary heater comprising a metal plate, preferably made of aluminum, joined to a plate made of dielectric and thermal insulating material constrained to a respective plate of the press, and each metal plate of the auxiliary heaters including an electrically insulated resistive component;

means for controlling the secondary electric generators, programmable for varying the intensity of the current supplied to the auxiliary resistive heaters in a manner so as to increase the temperatures measured inside the respective metal plates according to the aforesaid pre-established gradualness, the power dissipated by the auxiliary heaters being enough for obtaining in respective top and bottom packs of the stack approximately the same temperature as measured inside the stack.

In one embodiment of the auxiliary resistive heaters, in said metal plate, longitudinal through holes are made that are equidistant from each other over the entire width, and an armored electrical resistor with cylindrical shape is inserted at the interior of such holes.

In another embodiment of the auxiliary resistive heaters, a rectangular slit is obtained in said metal plate that is nearly as wide as the plate, and in such slit a thick silicone sheet is inserted that incorporates a resistive coil.

In another embodiment of the auxiliary resistive heaters, a rectangular cavity is obtained in said metal plate that is nearly as wide as the plate, and an armored resistor with resistive coil made of steel bar is inserted in such cavity, such resistor insulated with mica sheet from its anodized aluminum casing of parallelepiped shape.

According to one aspect of the system invention, the metal plates of the auxiliary resistive heaters are connected to strong amperage conductors coming from respective terminals of the main electric generator, the strong amperage conductor, connected to the metal plate constrained to a movable surface of the press, has a flexible terminal section capable of supporting the movement thereof, said metal plates of the auxiliary resistive heaters are in electrical contact with the overall surface or respective copper tape portions on the bottom and at the top of the stack.

According to one aspect of the invention, the system also includes:
- a stack-carrier metal tray on which opposite tracks are fixed, such tracks mutually spaced greater than the maximum dimension of the normally-stacked packs;
- first sliders constrained in pairs to said tracks;
- rods integral with the first sliders and orthogonal to the tracks, such rods directed towards the opposite track;
- second sliders shaped as edge-protector brackets, slidable along said rods and constrained thereto;
means for locking said sliders against the respective constraints, so as to adjust the mutual distances between the same sliders in a manner so as to immobilize stacks which differ from each other due to pack size.

ADVANTAGES OF THE INVENTION

The two additional heaters, respectively the upper and lower heater, due to the heat produced and to their thermal insulation towards the cold surfaces of the press, create a barrier against the dispersion of the heat generated inside the stack. Those packs closest to the two ends of the stack are the main beneficiaries of the additional heat; this compensates for the lower heating that they would have due to their position. It follows that there is an increased constancy of the temperature along the entire stack, such that there is no longer the risk of having to discard packs.

Therefore, due to the synergy between the different heaters used in the new system, it is possible to maximize the number of packs that are suitable for the purpose of the production cycle, going beyond the limitations of the old multi-surface presses—in which the increased cooling of the central packs leads to a reduction of the stackable packs—as well as the limitations in the use of only one resistive copper heater, in which there was a real probability that the packs closest to the ends of the stack would have to be discarded.

In addition, due to the connections of the terminals of the main electric generator to the metal plates of the upper and lower heaters, a vast electrical contact area with the copper heater strip is made available, improving the reliability of the aforesaid contact, through which direct currents on the order of thousands of amperes can travel.

The use of anodized aluminum separator plates facilitates the construction of the stack, since it is not necessary to plate the insulating paper sheets on the two faces of the same plates, and also the fact that the anodized aluminum is thermally radiating does not prevent the increase of the temperature in the stack of packs.

The use of an airbag for the pressure makes possible a uniform distribution of the pressure over the entire surface of the upper face of the stack of packs. Finally, due to the four angular stops, individually positionable along two directions orthogonal to each other, stacks of packs of different size remain stable at the center of the stack-carrier tray both during the preparatory maneuvers and during the hot pressing.

BRIEF DESCRIPTION OF THE FIGURES

Further objects and advantages of the present invention will be clearer from the following detailed description of an embodiment thereof and from the enclosed drawings given as a merely non-limiting example, in which.

DETAILED DESCRIPTION OF SEVERAL PREFERRED EMBODIMENTS OF THE INVENTION

In the following description, equivalent elements which appear in different figures can be indicated with the same symbols. In the illustration of one figure, it is possible to refer to elements not expressly illustrated in that figure but in preceding figures. The scale and proportions of the various depicted elements do not necessary correspond with the actual scale and proportions.

Figure 3:
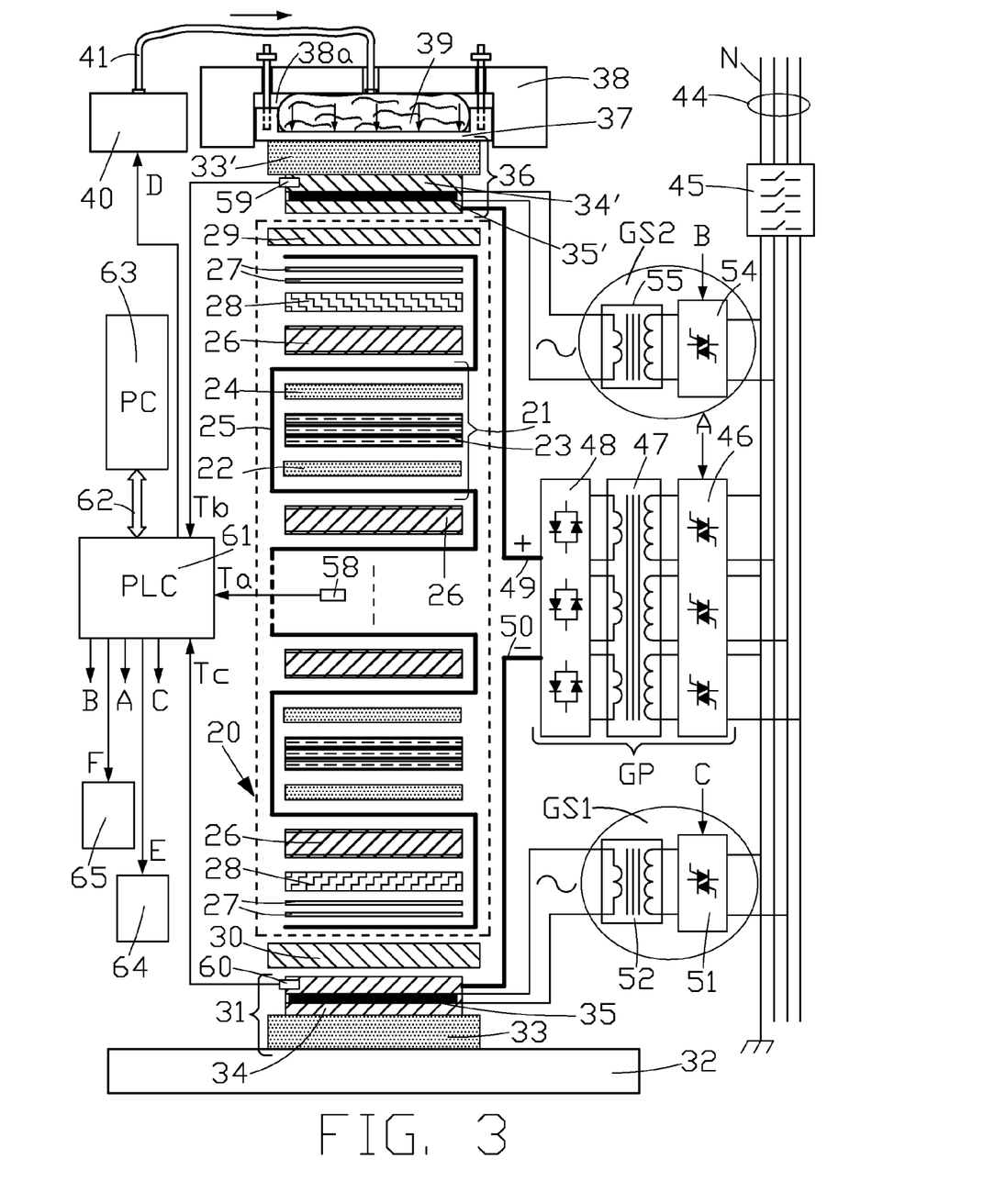
FIG. 3 is a schematic view of a system obtained according to the present invention for manufacturing a stack similar to that of FIG. 1.

With reference to FIG. 3, one can observe the schematization of a system for manufacturing a plurality of multilayer packs 21 for printed circuits, superimposed to form a stack 20 placed between the fixed lower surface 32 and the movable upper surface 38 of a press (70 in FIG. 5) with pneumatic movement and compression. Each pack 21, from the bottom upward, is constituted as follows:

a lower copper layer belong to a copper strip 25;

a lower prepreg layer 22 a stratification 23 made of dielectric layers variously metalized on at least one face, alternated with prepreg layers;

an upper prepreg layer 24;

an upper copper layer also belonging to the copper strip 25.

Between one pack 21 and the subsequent, an anodized aluminum plate 26 is inserted. The copper strip 25 comes from a continuous sheet wound in a roll, and as it is progressively unrolled, it is also systematically folded as a coil around the groups of stratifications 22, 25, 24, in order to complete the packs 21, and around the separator plates 26 adjacent thereto, for the entire height of the stack 20. In the copper strip 25, an electric circuit is made to circulate which, due to its resistive behavior, heats the strip, in such a manner heating the stack from the inside. The use of only one copper strip 25 instead of the preferred two-strip configuration of FIG. 2 is given only for the purpose of simplifying the drawing and does not at all limit the modes of the additional heat supply according to the present invention. In the construction of the copper coil, the loops open on the right in the figure belong to the packs 21 while the loops adjacent thereto open on the left include the plates 26; right and left can exchange roles. In the stack 20, the upper loop and the lower loop include an identical structure comprising in order: a plate of anodized aluminum 26 in contact with the copper strip 25, two sheets of Kraft paper 27, a pad layer 28 (cushion pad) constituted by aramid fiber fabric and silicone binder. The function of the sheets 27 and the pad 28 is that of balancing the pressure exerted by the surfaces of the press on the surfaces of the two ends of the stack 20. The copper strip 25 situated at the base of the stack 20 abuts against a stack-carrier tray 30, constituted by a plate of non-anodized aluminum that can be moved back and forth on opposite sides of the press. During the pressing cycle, the aluminum tray 30 abuts against a heating plate made of non-anodized aluminum 34 superimposed on a dielectric plate 33 and rigidly connected thereto. The latter abuts against the lower surface 32 of the press, where it is stably fixed. The assembly of the heating plate 34 and the dielectric plate 33 constitutes a device 31 also functioning as "thermal barrier" against the downward escape of endothermic heat generated in the stack 20, thus preventing a temperature lowering of the packs placed in the lowest part of the stack with respect to the central packs. In one embodiment, the dielectric plate 33 is made of epoxy glass G11 with 60 mm thickness; such name refers to a stratified composite material based on glass fibers orthogonally arranged in a reticulated epoxy resin.

The heating plate 34 can be obtained according to different modes. A preferred mode consists of making in the plate 34, 25 mm thick, a certain number of longitudinal holes equidistant from each other over the entire length, and introducing therein respective armored resistors 35 of "candle" type, connected in parallel between the terminals of a 230 V alternating current power supply. Such resistors are constituted by a cylindrical steel case, in which an iron-nickel or nickel-chrome resistor is encapsulated; the fill material, silicone or concrete, is electrically insulating and thermo-conductive. In the current case, eight 2 kW resistors are equipped with cylindrical case with 15 mm diameter. The number of resistors and the individual absorption depends on the size and number of packs 21 in the stack 20.

A second mode consists of obtaining a rectangular sit in the plate 34 that is nearly as wide as the plate and inserting therein a thick sheet of silicone which incorporates a resistive coil.

A third mode consists of making a rectangular cavity in the plate 34 that is nearly as wide as the plate and inserting therein the armored resistor described in the Italian patent No. 0001374127 by the same applicant; such resistor is constituted by a resistive coil made of steel bar, insulated with mica sheet from the anodized aluminum casing with parallelepiped shape.

In the upper part of the stack 20, an aluminum plate 29, which did not undergo anodizing, abuts against the copper strip 25. The fact that the stack-carrier tray 30 and the plate 29 are made of aluminum does not preclude the possibility of using other metals or alloys. The upper surface 38 of the press has a cavity 38a at its interior that is open on the lower part in order to allow the inclusion of a free base 37 to vertically translate without leaving the cavity. The base 37 delimits, in the cavity 38a, a chamber with rigid walls and with variable volume, at whose interior an airbag 39 is housed connected to a compressor 40 by means of a flexible tube 41. The airbag 39 is an air chamber that when deflated has a flattened, nearly rectangular shape and that, when expanded, is capable of completely filling the cavity 38a up to its maximum extension downward. The lower face of the movable base 37 is fixed to a dielectric plate 33', in turn fixed to a heating plate 34' at whose interior armored resistors 35' of candle type are present. Plate 33' and plate 34' both belong to a device 36 constrained to the upper surface 38 of the press, entirely identical to the lower device 31 and as such it too acts as a "thermal barrier" against the upward escape of the endothermic heat generated in the stack 20, thus preventing a temperature lowering of the packs placed in the highest part of the stack with respect to the central packs.

The electric power for heating the copper strip 25 and the resistors 35 and 35' is provided by the 400 Volt three-phase electric network. The three phase conductors of the network 44 and the neutral wire N (grounded) are suitably sectioned by a disconnecting switch 45 with four contacts. Most of the power is absorbed by the copper strip 25 through a system of modulation of the alternating power and transformation into direct current, comprising controlled switches 46 obtained in the solid state, typical of the thyristors, connected between the network 44 and the primary winding of a descending three-phase transformer 47; the secondary winding of the latter is connected to a three-phase rectifier 48 which provides a direct current with high amperage under an adjustable 60 Volt voltage. As can be observed in the figures, the positive (+) and negative (−) terminals of the rectifier 48 are respectively connected to the aluminum heating plates 34' and 34 by means of two strong conductors 49 and 50; the conductor 49 terminates with a flexible segment in order to support the translation of the upper surface 38 of the press. The current which exits from the positive terminal (+) flows into the upper heating plate 34', through the upper aluminum plate 29, slides from one end to the other of the copper strip 25, heating the stack 20 from the inside, crosses the stack-carrier tray 30 (also made of aluminum), flows into the lower heating plate 34, and finally reaches the negative terminal (−). The elements 46, 47, and 48 constitute a main direct current electric generator GP. The electric power alternating current, for the heating of the group of resistors in parallel 35 which heat the lower plate 34, is provided by a modulation system comprising a controlled switch 51, typically a thyristor, connected to one phase of the electric network 44 and to the primary winding of a single-phase insulation transformer 52. The elements 51 and 52 constitute a secondary alternating current electric generator GS1. Similarly, the alternating current electric generator, for the heating of the group of resistors in parallel 35' that heat the upper plate 34', is provided by a modulation system comprising a controlled switch 54 connected to a different phase of the electric network 44 and to the primary winding of a single-phase insulation transformer 55. The elements 54 and 55 constitute a secondary alternating current electric generator GS2. The transformers 52 and 55 can share the same core. Below, the controlled switches 46, 51, 54 are also called drivers.

The electrical power modulators provided to the copper strip 25 and the group of resistors 35 and 35' are linked with a temperature control that employs at least three thermal probes, of which a first 58 is situated at the center of a stack 20, a second 59 in a niche obtained in the upper heating plate 34', and a third probe 60 in a niche obtained in the lower heating plate 34. For increased safety, each probe is redundant. The thermal probes 58, 59, 60 are connected to a programmable logic controller 61 (PLC) in turn connected, by means of a bus 62, to a Personal Computer (PC) 63 which executes the program for actuating the hot pressing cycle of the stack 20. The system of FIG. 3 also comprises a vacuum pump 64 and a ventilation apparatus 65, both connected to the PLC, like the compressor 40. The pump 64 serves to generate the desired vacuum level in a hermetic chamber (73, FIGS. 5 and 6) which contains the stack 20 during the hot pressing cycle. The fan 65 starts to function with pressing cycle terminated in order to more quickly cool the upper plate 34' by means of the conveyance of a flow of ambient air into a tube equipped with nozzles opposite the aforesaid plate and at a short distance therefrom.

In functioning, the stack 20 at the end of an initial preparatory step is situated at the center of the tray 30 positioned under the surface 38 of the press. Four pneumatic actuators (not shown) lower the upper surface 38 until the plate 34', with airbag deflate, comes into contact with the aluminum plate 29 placed at the top of the stack 20. At this point, the PC 63 generates, by means of the PLC 61, a signal D which activates the compressor 40 for a time sufficient to inflate the airbag 39 at the pressure P initially pre-established on the stack 20. The PLC 61, before starting a work cycle, generates a signal E which activates the vacuum pump 64; such pump is activated for a time necessary for reaching a vacuum level sufficient for avoiding the formation of bubbles in the multilayer during the hot pressing. After which, the PC 63 by means of the PLC 61 generates three signals A, B, C, respectively directed to the drivers 46, 54, 51 in order to start the heating cycle of the copper strip 25 and the resistors 35' and 35. After a certain delay due to the thermal inertia of the heated elements, the thermal probes 58, 59, 60 generate respective analog signals Ta, Tb, Tc proportional to the measured temperatures; these signals are directed to the PLC, which digitizes them with suitable rhythm and transfers the number values on the bus 62. The PC 63 executes a continuous monitoring of the bus 62 in order to acquire the temperature values Ta, Tb, Tc necessary for generating new values of the signals A, B, C, which control the respective drivers via feedback according to the logic of the stored program. In summary, such program is set to ensure that all the packs 21 of the stack 20 share a same temperature increase profile, up until the complete reticulation of the resin. Such object can be attained by knowing, ahead of time, the time progression of an ideal growth curve of the temperature in the presence of pressure which better suits the type of stack of packs to be pressed.

A similar ideal curve Tai(t) can be obtained on the basis of known chemical-physical phenomena which affect the epoxy resin present in the prepreg adhesive layers. Such phenomena include a polymerization reaction (gelification) of the components of the resin in the presence of a catalyst and the reticulation of the resinous gel until a layer of vitreous type is achieved. A curve Tai(t) useful for the purpose increases linearly over time with a gradient that depends on the maximum electric power transferrable to the copper strip 25 over time, and is limited by the effects of the temperature on the chemical-physical reactions that occur in the epoxy resin. Once the value of about 180° C. is reached, it is convenient to make the temperature Tai(t) increase a few more degrees, much more slowly, in order to complete the reticulation. The terminal segment of the curve Tai(t) represents the post-cure phase necessary for improving the final characteristics of the multilayers, characteristics which will be maintained even after the return to ambient temperature. A theoretical curve Tai(t) similar to that just assumed was obtained by means of repeated experimentation in the field; such curve is nearly completely superimposable on the real curve Ta(t) of FIG. 4. Other theoretical curves Tai(t) can be assumed, in any case they will be subdividable into a succession of rectilinear segments, separately approximatable by the heating control algorithm. The curve Tai(t) was sampled with rate such to not loss information and the samples were previously written in an accessible memory in the PC 63. The minimum sampling frequency of the theoretical curve is greater than or equal to the frequency with which the PC 63 will acquire the real values of the temperatures Ta, Tb, Tc. The pressure P on the stack 20 is increased with step progression, the passage from one step to the next only occurs when the temperature Tai(t) has reached a pre-established value. With regard to that stated, it is inferred that the pressure P(t) depends on the time in an indirect manner, given that it is a P(Tai(t)) function. The ideal curve Tai(t) allows simplifying the algorithm for controlling the three heaters 25, 35, 35', since it is sufficient to set, in the program, the increase gradient as linear and the final temperature Taf of each segment as linear, e.g. (5° C.)/(60 s) and 180° C. for the first segment, so that PC calculates a series of values of the function Tai(t) and memorizes them. The PC then calculates the difference between the temperature value Ta measured at time ts and the corresponding stored value Tai (ts), and based on the difference (Ta−Tai) in value and sign it generates, by means of the PLC 61, a signal A towards the drivers 47 in order to modify in a suitable manner the duration of the conduction. This means that if Ta>Tai, the duration of the conduction is decreased in proportion to the difference ΔT, whereas if Ta<Tai the duration of the conduction is increased in proportion to the modulus of the difference ΔT. The temperature value Ta is to some extent affected by the heat contributions supplied by the two heating plates 34 and 34', whose temperatures Tc and Tb are also measured at time ts and thus compared with the theoretical temperature value Tai at time ts. This because the objective to attain is that of uniformity of temperature Ta overall all the 21 of the stack 20, therefore also the values of the temperatures Tc and Tb will have to converge towards the theoretical values Tai corresponding to the times ts. That stated ensures the stability of the thermal control algorithm in its entirety, thus preventing the onset of dangerous thermal oscillations, significant and enduring, between the center of the stack 20 and the two ends. The PC 63 therefore controls the temperatures Tc and Tb as said for the temperature Ta, by means of the PLC 61 generating two independent signals B and C respectively sent to the drivers 54 and 51 in order to modify the duration of the conduction in a suitable manner. The signals A, B, C control the duration of the conduction by setting the shutdown delay of the respective drivers with respect to the zero passage of the sinusoidal voltage; the greater the delay, the higher the effective voltage available, and hence the effective current, the resistance values being constant.

Figure 4:
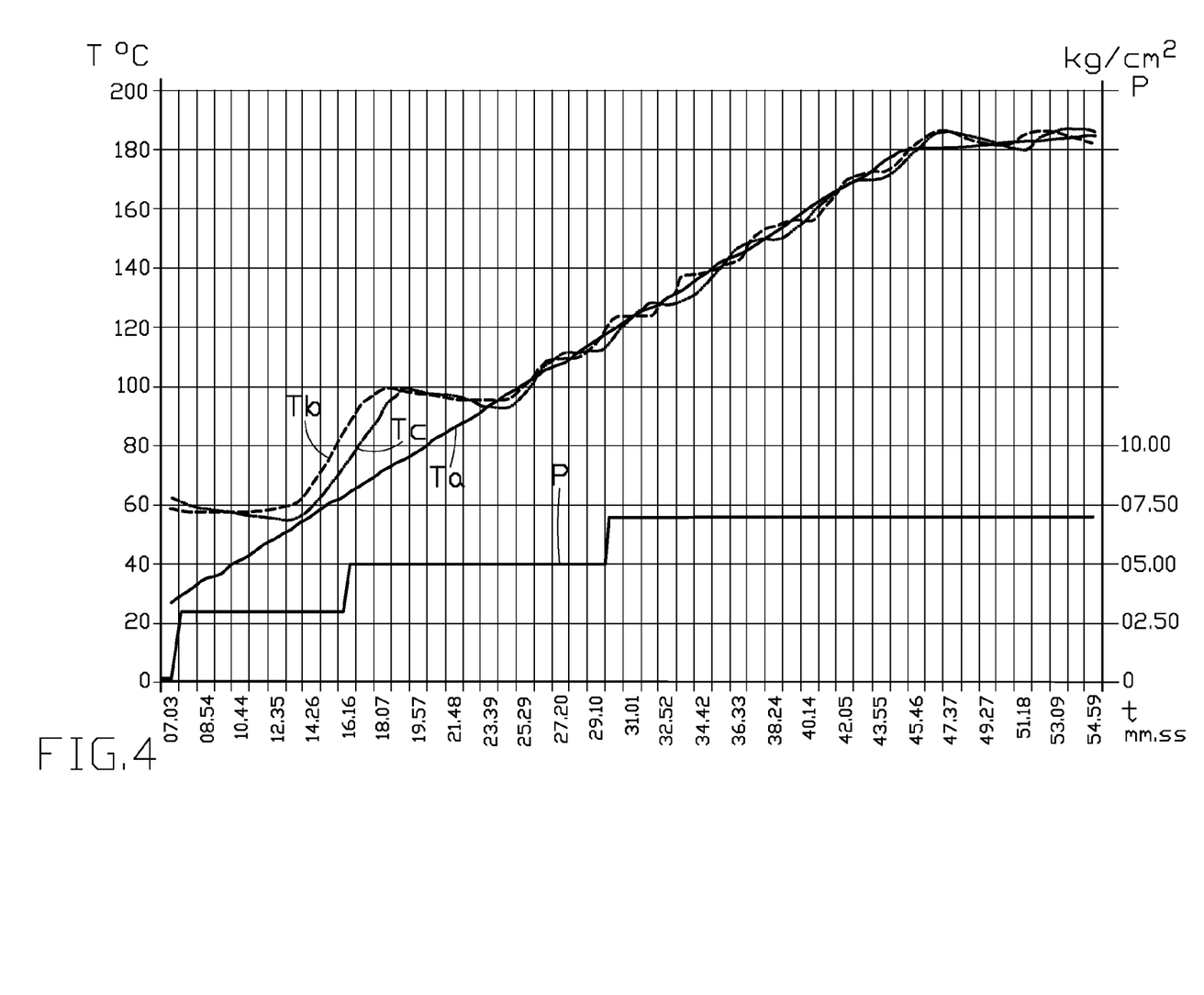
FIG. 4 is a bivalent graph, constructed with the values of Table 1 in the APPENDIX, which reports in the scale of a first ordinate the time progressions of the temperatures measured in three specific points of the stack of FIG. 3, and reports in the scale of a second ordinate the time progression of the pressure exerted on the stack of packs as a function of the temperature measured at the center of the same.

FIG. 4 graphically reports the values of the measurements Ta, Tb, Tc carried out every 55 seconds and stored in the Appendix—Table 1 which mirrors the contents of a work memory. With another scale, the graph also reports the progression of the pressure P on the stack 20. The real temperature curve Ta(t) in FIG. 4 is an excellent approximation of the ideal progression Tai(t), the deviations of ±2° C. from the linear progression maintained by the control system are not very noticeable in the adopted temperature scale. The temperature curves Tb(t) and Tc(t) instead have a oscillatory progression that is rather clear in the initial section, but starting from about 100° C. such course is quickly damped and converges towards the progression of the curve Ta(t), with oscillations contained within ±5° C. The cause of one such oscillatory progression is to be found in the lower thermal inertia of the two plates 34 and 34' with respect to the stack 20. This does not at all compromise the final outcome, since the increased widths affect a temperature interval in which the resin is poorly polymerized. At the end of the pressing cycle, the drivers 46, 51, 54 are turned off in order to bring the temperatures Ta, Tb, Tc to ambient value. After which, the PC 63 by means of the PLC 61 deactivates the vacuum pump 64 and sends an activation signal F to the ventilation apparatus 65 in order to accelerate the cooling of the upper plate 34'.

The following Table 2 reports several stack types 20 useable in the system of FIG. 3 and the respective maximum electrical quantities.

| Minimum height of the stack | Maximum height of the stack | # of packs (1.6 mm thickness) | | Maximum DC in the | Maximum voltage on the |
| --- | --- | --- | --- | --- | --- |
| mm | mm | Minim | Maximum | strip A | stack V |
| 70 | 165 | 6 | 50 | 2,000 | 65 |
| 135 | 185 | 45 | 65 | 1,650 | 120 |
| 235 | 265 | 80 | 100 | 3,300 | 160 |

The width of the copper strip 25 is selected as a function of the design needs of the designers of printed circuits, at most one can state that it varies from a minimum width of 300 mm until it arrives at a maximum width of 1,400 mm. The thicknesses of the copper strip 25 are standardized, and the most common are: ¼ Ounce (9 micron); ⅜ Ounce (12 micron); ½ Ounce (18 micron); 1 Ounce (35 micron); 2 Ounces (70 Micron); 3 Ounces (105 Micron). The length of the copper strip 25 depends on the number of packs to be pressed and hence on the type of stack: the minimum length can be several tens of meters, the maximum about 200 meters. With the passage of the current in the copper strip 25, the thermal energy provided is the same at every level of the stack 20.

Figure 5:
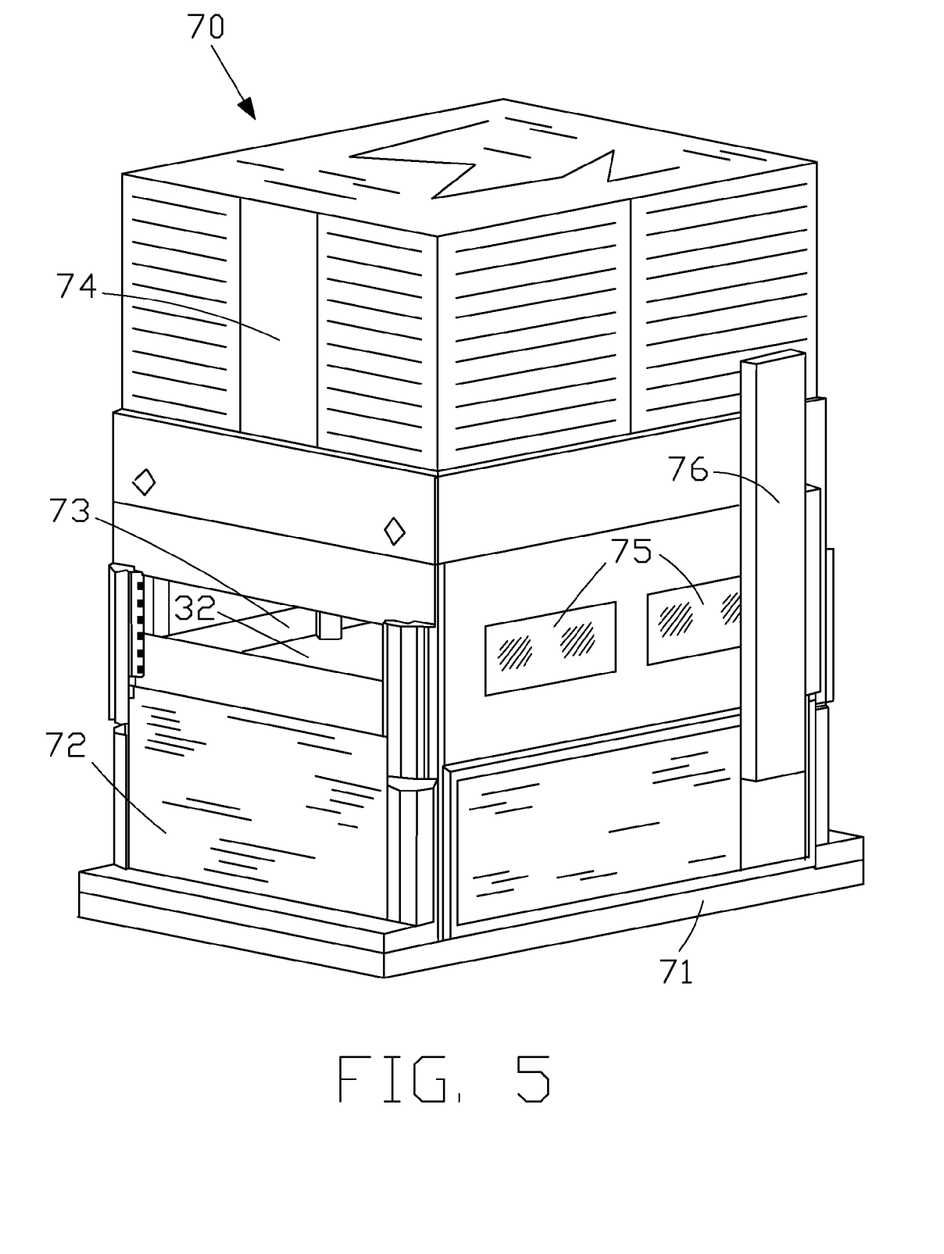
FIG. 5 is a perspective view of the press schematized in FIG. 3 without the stack of multilayer packs.

FIG. 5 is a perspective view of a press 70 suitable for manufacturing a plurality of multilayer packs for printed circuits in a single work cycle, according to that anticipated in the description of FIGS. 3 and 4. With joint reference to FIGS. 5 and 3, one can observe that the press 70 has a base 71 for anchoring a strong support frame of the support surface 32 of the material to be pressed. The frame subdivides the press into three compartments 72, 73, 74 superimposed on each other. The lower compartment 72 is delimited on the upper part by the abutment surface 32; four columns abut on this surface in nearly angular position, and such columns support the floor of the upper compartment 74. The intermediate compartment 73 is laterally delimited by walls with pneumatic seal, of which two opposite walls are fixed and include portholes 75 for looking inside during working, while the other two walls are removable, like doors, in order to allow the insertion of the tray 30 with the stack 20 of packs 21 at the center. In FIG. 5, the "body" of the press 70 is substantially shown; greater structural details will be provided hereinbelow and in the illustration of the subsequent FIGS. 6 to 13. Housed in the lower compartment 72 are the voltage stabilizers and the apparatuses for supporting the pneumatic functioning of the actuators, along with the vacuum pump 64 which creates the vacuum in the intermediate compartment 73. Such support apparatuses and the vacuum pump 64 could be situated outside the press 70. The aforesaid support apparatuses include a compressor 40 and relative distribution valves for carrying out the following functionalities: a) the actuation of four pneumatic cylinders for translating in the two directions the upper surface 38 of the press 70; b) the inflation of the airbag 39 which exerts the pressure on the stack 20; the cooling of the upper heating plate 34' once the work cycle is completed (fan 65); the actuation of the lifting actuators for the tray 30 upon introduction of the stack 20 between the surfaces of the press. Also housed the lower compartment 72 is the electronic control system constituted by the PLC 61 and by the mother board of the PC 63. The latter comprises a non-volatile memory in which the program is written which governs the functioning of the press 70 (firmware). A suitable interface connector connects the mother board to an external position of the PC 63 which is available to the operator for inserting the main functioning parameters of the work cycle and for updating the contents of the program memory. In the intermediate compartment 73, the following are housed: naturally the tray 30 with the stack 20, the auxiliary heaters 31 and 36 and relative thermal probes 60 and 59; the thermal probe 58 at the center of the stack 20; the upper surface 38 of the press 70 and the relative four double-acting pneumatic cylinders for its movement; and the airbag 39 con relative movable containment wall 37. In the upper compartment 74, the following are housed: magnetic switches of protection from overloads, the electric power supplies comprising the transformers 47, 52, 55 and relative control electronics constituted by the solid state devices 46 and 48, 51, 54. Two strong cylindrical copper bars run beside each other from the lower compartment 72 to the upper compartment 74 in order to supply the drivers and transfers with power. An insulating casing 76 encloses these bars for protection purposes.

Figure 6:
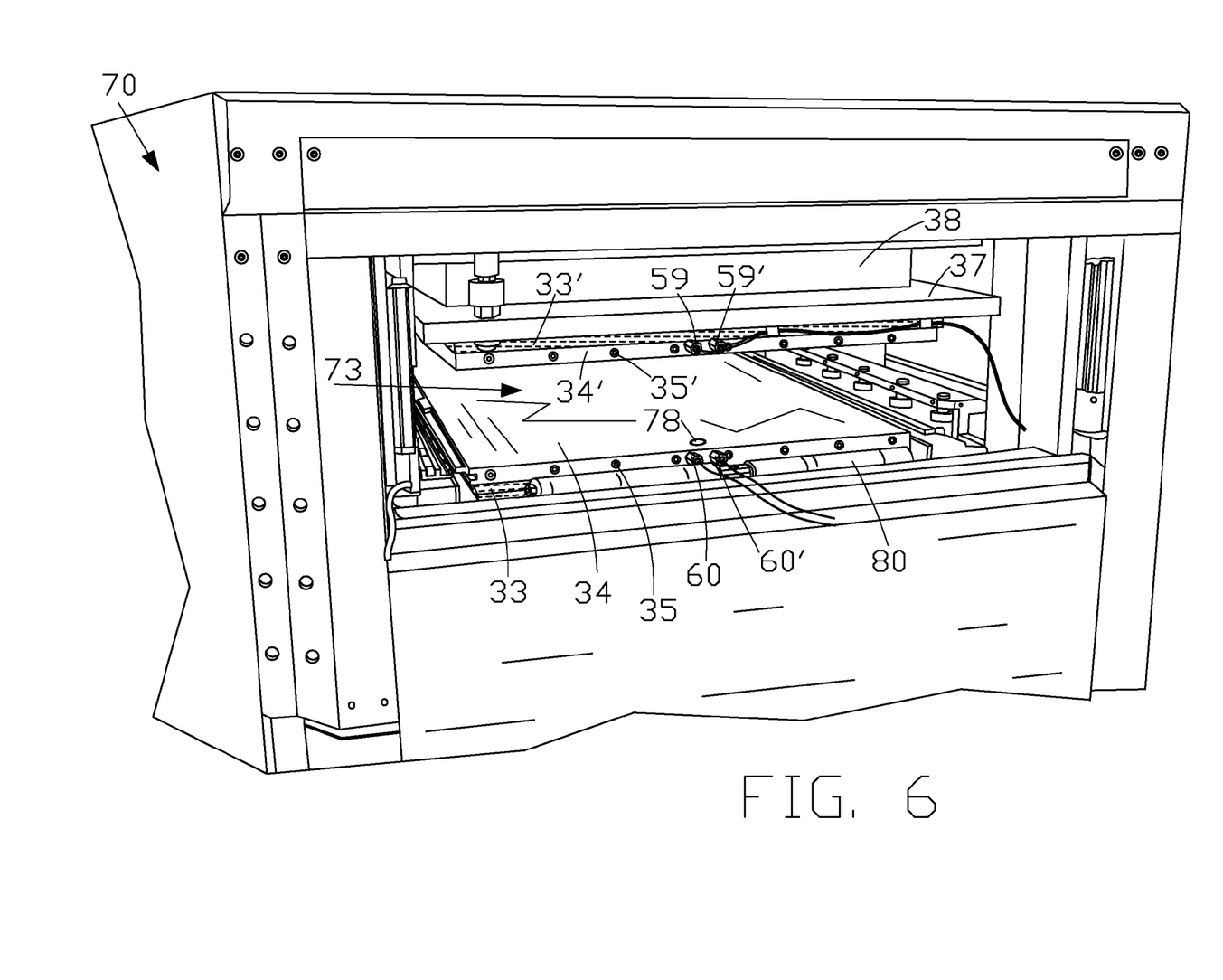
FIG. 6 shows a perspective view of the interior of the press of FIG. 5, clearly underlining two heating plates respectively constrained to the fixed lower surface and movable upper surface of the press.

FIG. 6 shows a perspective view of the interior of the intermediate compartment 73, without the tray 30 and relative stack of packs. In the figure, one can observe the two plates 34 and 34' heated by the groups of armored electric resistors of "candle" type, respective 35 and 35', (visible in FIG. 12), inserted in longitudinal holes equidistant from each other along the entire length. Between the two central resistors of each group, two other longitudinal holes are obtained, within which two thermal probes are inserted; such probes include a first pair of probes 59, 59' in the upper plate 34' and a second pair 60, 60' in the lower plate 34. Of the four thermal probes used, the two 59' and 60' are redundant for the safety purposes and are also connected to the PLC 61. The lower heating plate 34 is placed on top of the dielectric plate 33 to which it is fixed by means of two screws penetrating into holes 78 obtained on opposite sides of the plate, transversely thereto in positions adjacent to the holes for the thermal probes 60, 60'. The dielectric plate 33 abuts against the lower surface 32 of the press 70 and is fixed thereto by means of screws. Two rollers 80 are arranged in the press 70 in front of the lower heating plate 34, parallel thereto and slightly higher in order to facilitate the sliding of the tray 30 with the stack 20 of packs 21 at the time of its introduction. The upper heating plate 34' is placed below the dielectric plate 33' and fixed thereto by means of screws, as stated for the lower plate 34. The dielectric plate 33' is in turn fixed against the movable wall 37 of the chamber 38a that contains the airbag 39, and such wall is constrained to the upper surface 38 of the press 70, sharing its vertical translation of positioning on the stack 20, and maintaining the additional downward translation capacity during the inflation of the airbag 39. The intermediate compartment 73 has a fixed height which limits the maximum height of the stack 20, therefore the press 70 must be manufactured in different models in order to support the types of stacks di packs exemplified in Table 2. The differences between the maximum and minimum heights of the stack in each stack type are compensated by the downward translation of the upper surface 38 by the pneumatic actuators (not shown). On both sides of the lower heating plate, the rows of rollers are partially visible; such rollers guide the sliding of the tray 30 within the intermediate compartment 73 of the press 70.

Figure 7:
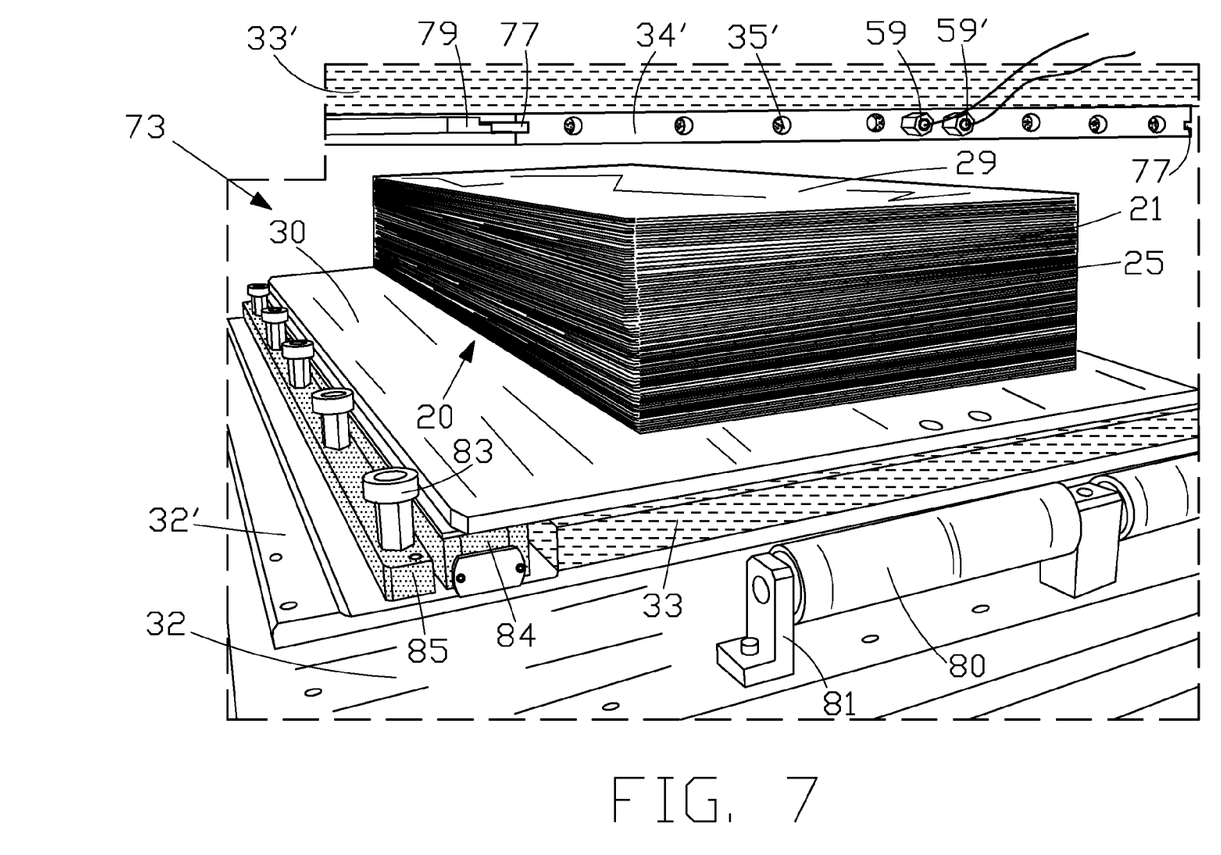
FIG. 7 shows a perspective view of a stack of packs like that of FIG. 3 placed on a stack-carrier tray placed on the lower heating plate of the press of FIG. 6.

FIG. 7 completes the preceding figure by showing the stack 20 on the aluminum tray 30 abutted against the heating plate 34 (covered by the tray). The stack 20 of packs can be obtained in the schematization with only one copper strip as indicated in FIG. 3 or in the preferred version with two copper strips of FIG. 2. At the top of the stack 20, there is the aluminum plate 29 in contact with the upper end of the copper strip 25, whose lower end is contact with the aluminum tray 30. As stated above, the terminals of the main current generator GP are respectively connected to the two aluminum heating plates 34 and 34' (the connection to the upper plate 34' will be underlined in FIG. 9) and such expedient ensures a wide surface for the electrical contacts with the strip 25 allowing a uniform distribution of the heating current. The tray 30 in the figure has reached its final position in the compartment 73 after a translation on the frontal entrance rollers 80 and on two rows of support rollers (shown with the number 82 in FIG. 8) arranged on both sides of the heating plate 34 in order to maintain the tray 30 slightly raised therefrom during translation, thus avoiding dragging. The translation of the tray 30 is guided by further rollers 83 which roll in contact with opposite flanks of the same while it advances; such rollers stably hold the tray 30 in position during the pressing of the stack 20. Along each of the two longer flanks of the upper heating plate 34', a longitudinal groove 77 is present for fitting with a flat barrier 79 anchored to the dielectric plate 33' in order to laterally immobilize the plate 34'. Two similar fitting barriers are also present on the dielectric plate 33 of the lower heating plate 34.

FIG. 7 shows a row of rollers 83 adjacent to the left flank of the tray 30 (examining the press 70 from the front side); a similar configuration is also present on the right side. With reference to the figures, a support 85 is observed of parallelepiped shape integral with the lower surface 32 of the press 70; exiting outward from the support 85 are the rotation pins of the rollers 83 fixed in vertical direction. A container 84 with parallelepiped shape is constrained to the lower surface 32 of the press adjacent to the support 85 under the tray 30. Within the container 84, a row of retractable rollers is present along with relative pneumatic lifting mechanism. A similar container is also present on the right side of the tray 30, as will be illustrated in the subsequent figure. The container 84, the support element 85, and the dielectric plate 33 are fixed to a steel base 32' integral with the lower surface 32 of the press 70. The container 84 and the support 85 are made of electrically insulating material, and this prevents the formation of a conduction path of the heating current between the aluminum tray 30 and the lower surface 32 by means of the metal rollers 82 and 83. Alternatively, it is possible to use rollers made of plastic material.

Figure 8:
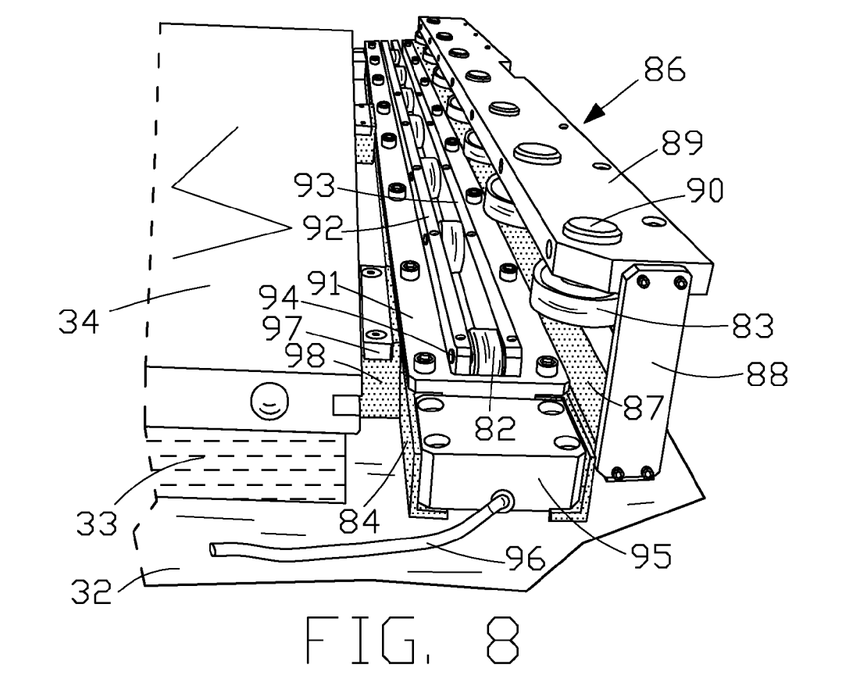
FIG. 8 shows a perspective view of two parallel rows of rollers with orthogonal axes present on the lower surface of the press of FIG. 7 on opposite sides with respect to the heating plate, with the purpose of facilitating the movement and the positioning of the stack-carrier tray of FIG. 7.
Figure 9:
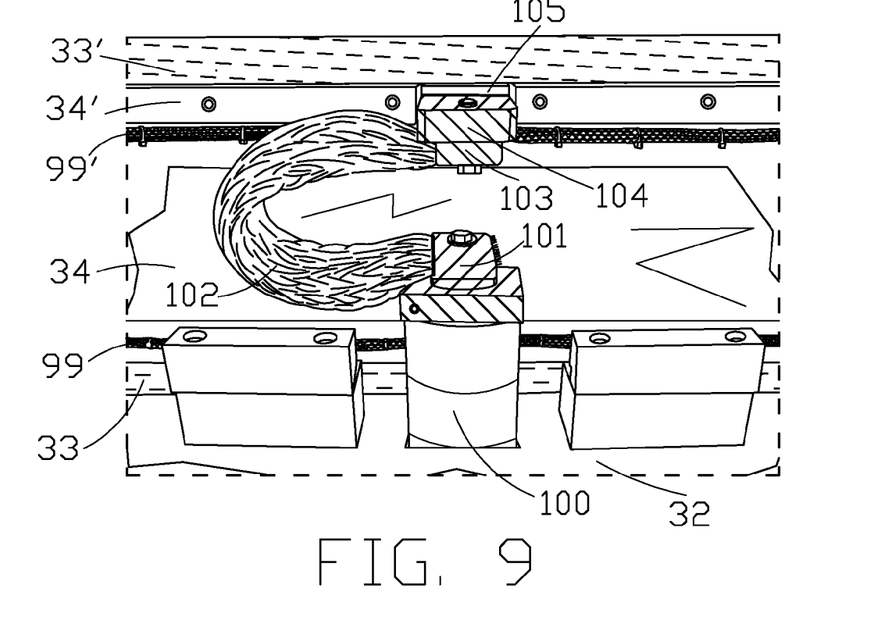
FIG. 9 shows a perspective view of a plaited conductor segment present at the upper end of a conductor bar of the electric heating current of a copper strip, crossing as a coil the stack of packs of FIG. 7.

FIG. 8 shows two rows of rollers 82 and 83 situated on the right side of the tray 30 of the preceding figure, the latter being removed from the drawing in order to allow a view of the underlying rollers 82. It is observed that a similar set of rollers 82 and 83 is also present on the left side. One can see in the figure the use of a support 86 for the lateral rollers 83 different from the support 85 used on the left side, the difference consisting of the fact that the rotation pins are hung rather than abutted. The support 86 is constituted by a longitudinal base 87 made of insulating material, from whose ends two shoulders 88 rise upwardly which support an oblong metal plate 89, in which the seats of the rotation pins 90 of the rollers 83 are obtained. The base 87 is integral with the lower surface 32 of the press 70 and the lower ends of the shoulders 88 are fixed to the base 87 without touching the metal surface 32. The pins are fixed in their seats in descending vertical direction, in a manner such that the lateral rollers 83 result hung from the plate 89. The container 84 of the support rollers 82 is situated between the support 86 and the heating plate 34. It is entirely hollow and open at the upper part where a metal frame 91 is fixed with screws to the longer edges of the opening, leaving two portions at the ends available for housing two blocks 95 for fixing the container itself. The entire row of rollers 82 is housed in a seat constituted by two parallel metal shoulders 92 and 93 joined by a base. The pins 94 of the rollers 82 cross the two shoulders 91 and 92 with proper distance from each other. The rotation of the rollers 82 occurs on strong radial bearings. On the visible side in the figure, the heating plate 34 is maintained spaced from the container 84 by means of grooves 87 fixed to respective insulating blocks 98. In the container 84, a pneumatic actuator is placed that is supplied by a duct 96 for the compressed air. This actuator comes into action when the stack 20 must be inserted or extracted from the pressing space; it lifts the seat of the rollers 82 with respect to the frame 91, and then the tray 30 the amount necessary such that their rolling surface exceeds the height of the heating plate 34, preventing the dragging of the tray. The deactivation of the actuator leads to the automatic lowering of the row of rollers 82 due to their weight. FIG. 9 shows the contact between the upper end of a conductor 100 and the aluminum plate 34' of the upper auxiliary heater 36, the lower end of this conductor being connected to the terminal (+) of the main electric generator GP. The conductor 100 is a cylindrical copper bar with large diameter, in consideration of the high amperage, inserted in a cylinder of plastic material which insulates it from the outside. A copper terminal 101 is fixed to the upper end of the cylindrical bar 100 in order to tighten one end of an electrical conductor of "plaited" type 102, whose other end is tightened by an analogous copper terminal 103 fixed to a short copper bar 104 inserted in a recess 105 on the side of the plate 34', by exerting a moderate pressure for ensuring good electrical contact. The length of the conductor plait 103 is greater than the maximum distance between the two heating plates 34 and 34' allowed by the type of stack of Table 2, and in such a manner it is possible to support the translation movement of the upper plate 34'. The lower heating plate 34 is connected to the terminal (−) of the main electric generator GP by means of a second cylindrical copper bar (not shown in the figures) with diameter equal to the bar 100.

Figures 10, 11, 12:
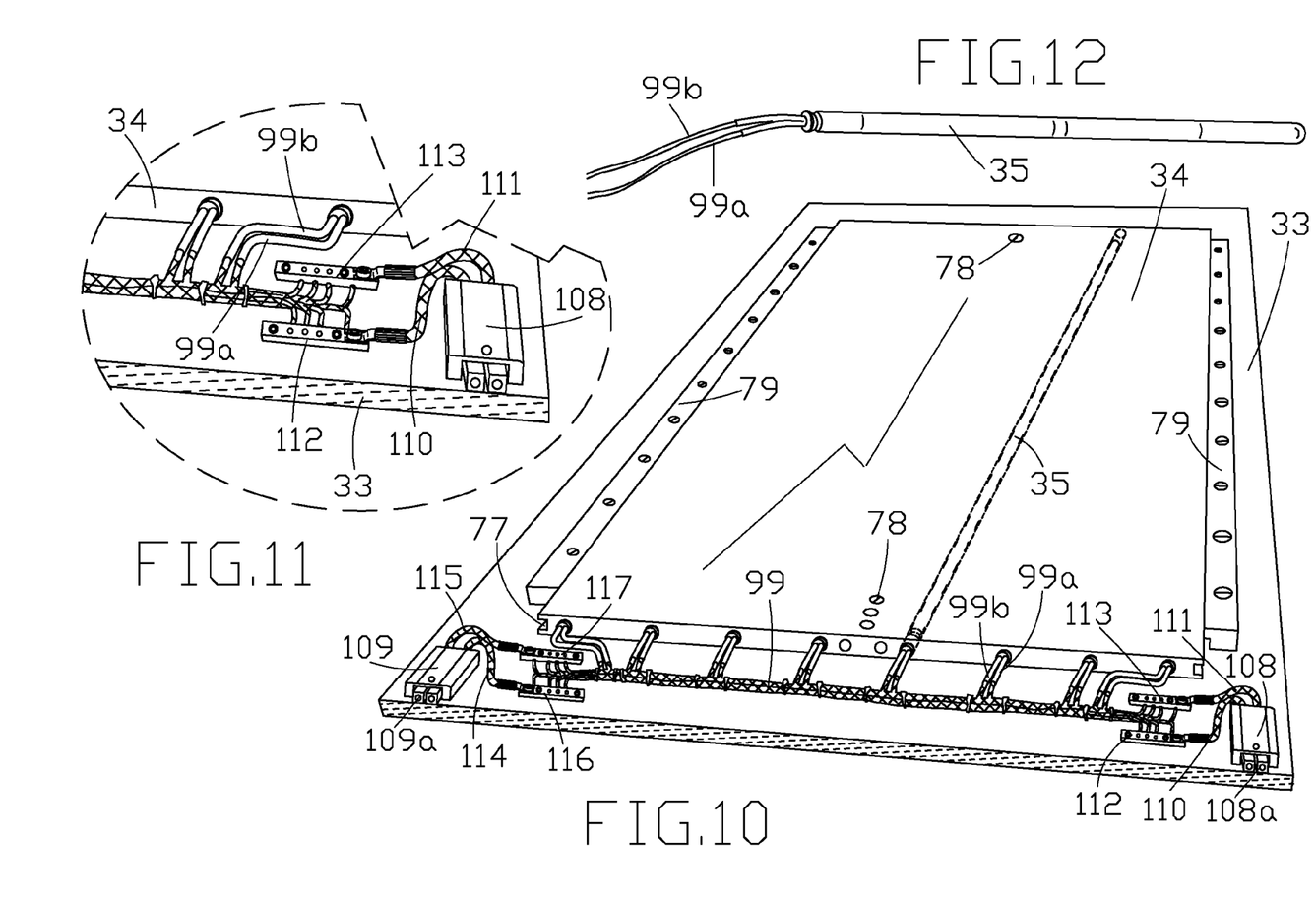
FIG. 10 shows the entire lower heating plate visible in FIG. 6.
FIG. 11 is an enlargement of the lower right corner of the heating plate of FIG. 10.
FIG. 12 shows one of the candle-like resistors inserted inside the plate of FIG. 11 in order to heat it electrically.

FIG. 10 shows a perspective view of the lower auxiliary heater 31 (FIG. 3) with the heating plate 34 fixed to the dielectric plate 33 by means of two screws penetrating into the holes 78, and further immobilized via fitting by the two lateral barriers 79 fixed with screws to the aforesaid plate, which also supports a wiring of wires 99 in order to supply power to the resistors 35. The upper auxiliary resistive heater 36 has the same configuration as the lower one 31, so that that stated for the latter is also valid for the former. One of the eight candle-like resistors 35 that heat the plate 34 is shown with a dashed line in its seat, and separately in FIG. 12. From the base of each resistor 35, two electric cables 99a and 99b are extended for the connection to the terminals of the secondary alternating current electric generator GS1, respecting the geometry of the wiring visible on the dielectric plate 33. With reference to FIG. 10 and to the partial enlargement of FIG. 11, such wiring comprises two flat plates 108 and 109 fixed to the dielectric plate 33, close to the corners of the plate 34 near the side of insertion of the resistors 35. The sockets 108 and 109 respectively have contacts 108a and 109a for connecting the terminations of the wires directed to the terminals of the secondary electric generator GS1. From the socket 108, two short cable segments 110 and 111 depart, and similarly from the socket 109 two short cable segments 114 and 115 depart. Inside each socket 108 and 109, the ends of the respective two cable segments are in mutual contact. The other ends of the cable segments 110 and 111 are connected to two respective blocks 112 and 113, each with four contacts. The other ends of the cable segments 114 and 115 are connected to two respective blocks 116 and 117 entirely equivalent to the preceding. The pair of blocks 112-113 is connected to the eight electric cables 99a of all eight resistors 35, while the eight electric cables 99b are connected to the pair of blocks 116-117, such that the eight resistors 35 are connected in parallel.

Figure 13:
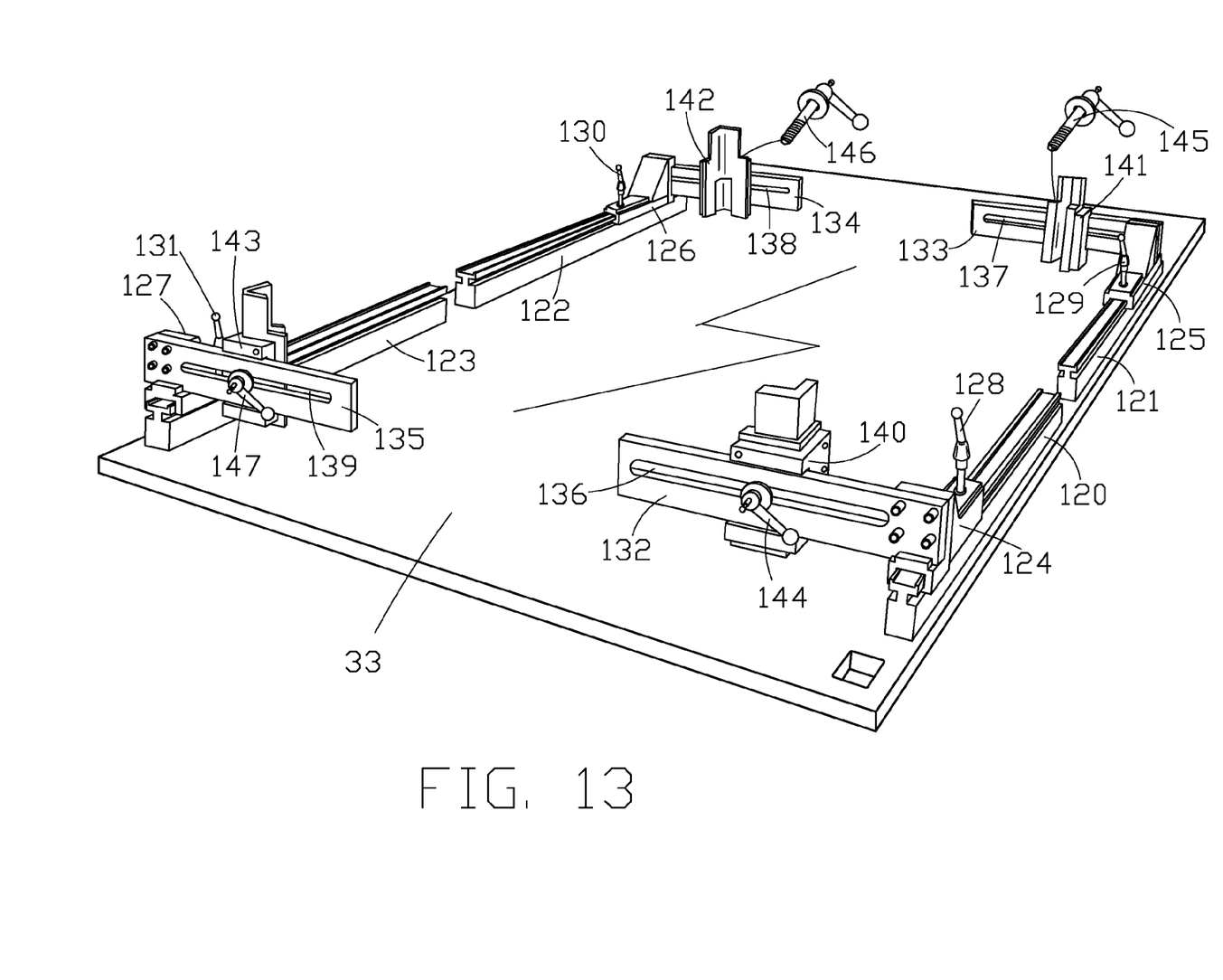
FIG. 13 is a perspective view of the tray of FIG. 7 on which a system is mounted capable of immobilizing stacks which differ from each other by the size of the packs.

FIG. 13 shows a perspective view of the aluminum tray 33 on which a double orthogonal slider system is mounted that is capable of immobilizing the edges of stacks of packs that differ from each other with regard to the size of the packs. With reference to FIG. 13, four identical tracks 120, 121, 122, 123 can be observed, aligned two-by-two close to the opposite sides of the tray 33. The tracks have two longitudinal grooves on the sides close to the upper end, in order to fittedly constrain respective sliders 124, 125, 126, 127 of tubular shape with rectangular section open at the base, between two short lateral appendages inwardly directed and slidable in said grooves. The sliders can be locked against their own tracks by means of the rotation of handles 128, 129, 130, 131 with stems threaded on the outside. The sliders also have a flattened shoulder at the most external end for fixing, by means of screws, a respective rectangular rod 132, 133, 134, 135 directed towards the interior of the tray 33 orthogonal to the tracks. Along the center line of the rods, there is a longitudinal slot 136, 137, 138, 139 which is extended for nearly the entire length. The four rods support four respective second sliders 140, 141, 142, 143 having the form of angular brackets of edge-protector type, with one face grooved for the insertion of the sliding rod. The sliders 140, 141, 142, 143 are locked against the respective rods by the rotation of handles 144, 145, 146, 147 equipped with a threaded stem at the end which crosses the slot, and before this a washer, in order to be screwed into the wall of the slider.

Operatively, the stack 20 is set at the center of the tray 33 with all the sliders in the initial more external positions; after this, the sliders 124, 125, 126, 127 are made to translate on their tracks towards each other, until they approach the rods 132, 133, 134, 135 on the two sides of the stack. At this point, the angular sliders 140, 141, 142, 143 are made to translate towards the interior, until they enclose the four corners of the stack and, after the necessary adjustments for eliminating the clearances between the edge-protectors and the stack, the locking handles are tightened.

It is possible to substitute the four short tracks with two long tracks with double length situated in the same manner on the track 33; it is also possible to use only two opposite rods whose ends are fixed to two sliders on opposite tracks. Based on the description provided for a preferred embodiment, it is obvious that several changes can be introduced by the man skilled in the art, without departing from the scope of the invention as results from the following claims.

APPENDIX TABLE 1

| Measurement No. | Time mm.ss | Ta °C. | Tb °C. | Tc °C. | P kg/cm² |
|---|---|---|---|---|---|
| 1 | 00.51 | ... | ... | ... | 0 |
| 2 | 01.44 | ... | ... | ... | 0 |
| 3 | 02.37 | ... | ... | ... | 0 |
| 4 | 03.30 | ... | ... | ... | 0 |
| 5 | 04.23 | ... | ... | ... | 0 |
| 6 | 05.16 | ... | ... | ... | 0 |
| 7 | 06.09 | ... | ... | ... | 0 |
| 8 | 07.03 | 27 | 59 | 62 | 3.0 |
| 9 | 07.58 | 31 | 58 | 60 | 3.0 |
| 10 | 08.54 | 35 | 58 | 59 | 3.0 |
| 11 | 09.49 | 38 | 58 | 58 | 3.0 |
| 12 | 10.44 | 42 | 58 | 57 | 3.0 |
| 13 | 11.40 | 46 | 58 | 56 | 3.0 |
| 14 | 12.35 | 49 | 59 | 56 | 3.0 |
| 15 | 13.30 | 53 | 60 | 55 | 3.0 |
| 16 | 14.26 | 57 | 67 | 60 | 3.0 |
| 17 | 15.21 | 61 | 77 | 67 | 5.0 |
| 18 | 16.16 | 64 | 87 | 75 | 5.0 |
| 19 | 17.11 | 68 | 96 | 84 | 5.0 |
| 20 | 18.07 | 72 | 99 | 92 | 5.0 |
| 21 | 19.02 | 75 | 99 | 99 | 5.0 |
| 22 | 19.57 | 79 | 98 | 98 | 5.0 |
| 23 | 20.53 | 83 | 97 | 98 | 5.0 |
| 24 | 21.48 | 86 | 96 | 97 | 5.0 |
| 25 | 22.43 | 90 | 96 | 95 | 5.0 |
| 26 | 23.39 | 94 | 96 | 93 | 5.0 |
| 27 | 24.34 | 98 | 96 | 93 | 5.0 |
| 28 | 25.29 | 101 | 100 | 98 | 5.0 |
| 29 | 26.25 | 105 | 108 | 106 | 5.0 |
| 30 | 27.20 | 108 | 110 | 111 | 5.0 |
| 31 | 28.15 | 112 | 110 | 112 | 5.0 |
| 32 | 29.10 | 116 | 115 | 112 | 5.0 |
| 33 | 30.06 | 120 | 123 | 117 | 5.0 |
| 34 | 31.01 | 123 | 124 | 124 | 7.0 |
| 35 | 31.56 | 127 | 124 | 128 | 7.0 |
| 36 | 32.52 | 130 | 129 | 128 | 7.0 |
| 37 | 33.47 | 134 | 137 | 130 | 7.0 |
| 38 | 34.42 | 138 | 139 | 134 | 7.0 |
| 39 | 35.38 | 142 | 140 | 140 | 7.0 |
| 40 | 36.33 | 145 | 143 | 147 | 7.0 |
| 41 | 37.28 | 149 | 151 | 150 | 7.0 |
| 42 | 38.24 | 153 | 155 | 150 | 7.0 |
| 43 | 39.19 | 156 | 156 | 152 | 7.0 |
| 44 | 40.14 | 160 | 156 | 157 | 7.0 |
| 45 | 41.09 | 164 | 162 | 163 | 7.0 |
| 46 | 42.05 | 168 | 170 | 168 | 7.0 |
| 47 | 43.00 | 171 | 172 | 170 | 7.0 |
| 48 | 43.55 | 175 | 172 | 170 | 7.0 |
| 49 | 44.51 | 179 | 175 | 174 | 7.0 |
| 50 | 45.46 | 180 | 182 | 180 | 7.0 |
| 51 | 46.41 | 181 | 186 | 185 | 7.0 |
| 52 | 47.37 | 181 | 186 | 186 | 7.0 |
| 53 | 48.32 | 181 | 184 | 185 | 7.0 |
| 54 | 49.27 | 182 | 182 | 183 | 7.0 |
| 55 | 50.23 | 182 | 181 | 181 | 7.0 |
| 56 | 51.18 | 183 | 185 | 180 | 7.0 |
| 57 | 52.13 | 183 | 187 | 184 | 7.0 |
| 58 | 53.09 | 184 | 186 | 187 | 7.0 |
| 59 | 54.04 | 184 | 184 | 187 | 7.0 |
| 60 | 54.59 | 185 | 182 | 186 | 7.0 |

The invention claimed is:

1. A method for manufacturing multilayer plastic laminates for printed circuits, comprising:

a) constructing a stack of single multilayer plastic laminates, below termed packs, alternated with separator plates that are thermally conductive and electrically insulated, each pack comprising dielectric layers metalized on at least one face alternated with pre-preg adhesive layers, the two outermost layers of each pack being constituted by respective portions of at least one metallic tape, repeatedly folded 180° in opposite directions in order to form loops of a serpentine that systematically crosses the stack over the entire height thereof;
b) applying, under vacuum, pressure of controlled value on said stack by means of a two-plate press and simultaneously generating heat inside the stack, the heat being developed by the electric current made to circulate in the serpentine metal tape, with resistive behavior, by a main electric generator whose power supplied to the metal tape is controlled in a manner so as to increase according a pre-established gradualness the temperature measured inside the stack for a time sufficient for hardening the adhesive layers and achieving therefore the mutual fixing of the various layers as well as of the metal tape portions to the layers mating thereto;
c) returning to the initial pressure and temperature conditions;
d) cutting the metal tape flush with the opposite flanks of the stack from where the metal tape exits outward, and disassembling the single packs metalized in such manner,
wherein during step b) an additional calorie intake is supplied to the two ends of the stack by means of two auxiliary resistive heaters constrained to the two plates of the press and thermally insulated therefrom, said auxiliary heaters being power-supplied by respective secondary electric generators controlled in a manner so as to increase the temperature of the auxiliary heaters according to the aforesaid pre-established gradualness, being the power dissipated by the auxiliary heaters enough for obtaining in respective top and bottom packs of the stack approximately the same temperature as measured inside the stack.

2. The method of claim 1, wherein the pressure is exerted on the upper auxiliary heater by means of an air bag inflated at an initially fixed pressure, subsequently increased via discrete steps upon verification of the obtainment of pre-established temperature values.

3. The method of claim 1, wherein said separator plates are made of aluminum with a black oxide anodized surface layer electrically isolating and thermally radiating.

4. The method of claim 1, wherein the current supplied by the main electric generator crosses a metal casing of each auxiliary heater that encloses the resistive component electrically insulated by the casing.

5. The method of claim 1, wherein the copper tape portion at the base of the stack abuts against an extractible metal tray, crossed by the current supplied by the main electric generator and by the thermal flow generated by the auxiliary electric heater on which the stack rests.

6. The method of claim 5, wherein the tray is made of aluminum.

7. The method of claim 1, wherein the loops of the copper tape formed at the top and on the bottom of the stack include, in sequence from the copper tape: two paper sheets of Kraft type, a damping pad layer made of plastic material, and one said separator plate.

8. The method of claim 1, wherein the two outermost layers of each pack being constituted by respective portions of two metallic tapes connected at their ends like two resistors in parallel crossed by the heating current for the stack, the two copper tapes forming along the stack two serpentines whose loops penetrate each other.

9. The method of claim 1, wherein a metal plate is placed upon the copper tape portion at the top of the stack, such plate crossed by the current supplied by the main electric generator and by the thermal flow generated by the auxiliary electric heater with which the metal plate is in contact, improves distribution of the pressure on the stack.

10. The method of claim 9, wherein the plate is made of aluminum.

11. The method of claim 1, wherein the metallic tape is made of copper.

* * * * *